United States Patent
Brakensiek et al.

(10) Patent No.: US 7,348,281 B2
(45) Date of Patent: Mar. 25, 2008

(54) METHOD OF FILLING STRUCTURES FOR FORMING VIA-FIRST DUAL DAMASCENE INTERCONNECTS

(75) Inventors: Nickolas L. Brakensiek, St. James, MO (US); Carlton A. Washburn, Rolla, MO (US); Earnest C. Murphy, St. James, MO (US)

(73) Assignee: Brewer Science Inc., Rolla, MO (US)

( * ) Notice: Subject to any disclaimer, the term of this patent is extended or adjusted under 35 U.S.C. 154(b) by 279 days.

(21) Appl. No.: 10/943,033

(22) Filed: Sep. 16, 2004

(65) Prior Publication Data

US 2005/0118800 A1 Jun. 2, 2005

Related U.S. Application Data

(60) Provisional application No. 60/504,368, filed on Sep. 19, 2003.

(51) Int. Cl.
*H01L 21/31* (2006.01)
*H01L 21/469* (2006.01)

(52) U.S. Cl. ............... 438/781; 438/623; 438/624; 438/761; 438/780; 257/E21.579; 257/E21.576; 257/E21.581

(58) Field of Classification Search ............... 438/99, 438/287, 82, 780, 781, FOR. 135, 725, 618, 438/622–624, 761, 778, FOR. 388, FOR. 395; 257/E21.576, E21.579, E21.581
See application file for complete search history.

(56) References Cited

U.S. PATENT DOCUMENTS 5,091,047 A 2/1992 Cleeves et al.

(Continued)

OTHER PUBLICATIONS

Aoi, Nobuo, et al., "A Novel Clustered Hard Mask Technology for Dual Damascene Multilevel Interconnects with Self-Aligned Via Formation Using an Organic Low k Dielectric," *1999 Symposium on VLSI Technology Digest of Technical Papers*, 1999.

(Continued)

*Primary Examiner*—Fernando L. Toledo
*Assistant Examiner*—Quovaunda Jefferson
(74) *Attorney, Agent, or Firm*—Hovey Williams LLP

(57) ABSTRACT

A method of forming via-first, dual damascene interconnect structures by using a gap-filling, bottom anti-reflective coating material whose thickness is easily controlled by a solvent is provided. After application to a substrate, the bottom anti-reflective coating is partially cured by baking at a low temperature. Next, a solvent is dispensed over the coated wafer and allowed to contact the coating for a period of time. The solvent removes the bottom anti-reflective coating at a rate controlled by the bottom anti-reflective coating's bake temperature and the solvent contact time to yield a bottom anti-reflective coating thickness that is thin, while maintaining optimum light-absorbing properties on the dielectric stack. In another possible application of this method, sufficient bottom anti-reflective coating may be removed to only partially fill the vias in order to protect the bottoms of the vias during subsequent processing. The solvent is removed from the wafer, and the bottom anti-reflective coating is cured completely by a high-temperature bake. The wafer is then coated with photoresist, and the trench pattern exposed. The bottom anti-reflective coating material used maintains a greater planar topography for trench patterning, eliminates the need for an inorganic light-absorbing material layer on the top of the dielectric stack, protects the bottom of the vias during the trench etch, and prevents the formation of fencing problems by using a solvent to control the thickness in the vias.

20 Claims, 16 Drawing Sheets

U.S. PATENT DOCUMENTS

| | | |
|---|---|---|
| 5,476,816 A | 12/1995 | Mautz et al. |
| 5,827,781 A * | 10/1998 | Skrovan et al. ............. 438/692 |
| 6,015,520 A | 1/2000 | Appelt et al. |
| 6,020,269 A | 2/2000 | Wang et al. |
| 6,127,070 A | 10/2000 | Yang et al. |
| 6,156,658 A | 12/2000 | Wang et al. |
| 6,165,695 A | 12/2000 | Yang et al. |
| 6,171,763 B1 | 1/2001 | Wang et al. |
| 6,197,678 B1 * | 3/2001 | Yu ............................. 438/627 |
| 6,200,907 B1 | 3/2001 | Wang et al. |
| 6,225,240 B1 | 5/2001 | You et al. |
| 6,306,560 B1 | 10/2001 | Wang et al. |
| 6,309,926 B1 | 10/2001 | Bell et al. |
| 6,323,123 B1 | 11/2001 | Liu et al. |
| 6,407,009 B1 | 6/2002 | You et al. |
| 6,440,640 B1 | 8/2002 | Yang et al. |
| 6,455,416 B1 | 9/2002 | Subramanian et al. |
| 6,458,705 B1 | 10/2002 | Hung et al. |
| 6,477,031 B1 | 11/2002 | Hayashi |
| 6,509,137 B1 | 1/2003 | Wang et al. |
| 6,606,793 B1 | 8/2003 | Dunn |
| 6,638,853 B1 | 10/2003 | Sue et al. |
| 2002/0016073 A1* | 2/2002 | Kondo et al. ................ 438/691 |
| 2002/0074659 A1* | 6/2002 | Dalton et al. ................ 257/758 |
| 2002/0110665 A1* | 8/2002 | Rutter et al. ................. 428/137 |
| 2003/0040179 A1 | 2/2003 | Thakar et al. |
| 2003/0054616 A1* | 3/2003 | Endisch et al. ............. 438/400 |
| 2004/0147108 A1 | 7/2004 | Lamb, III et al. |
| 2004/0183203 A1 | 9/2004 | Meagley et al. |

OTHER PUBLICATIONS

Brakensiek, Nick, "Bottom Anti-Reflective Coating Processing Techniques for Via-First Dual Damascene Processes," *Proceedings of SPIE*, vol. 4691, 2002, pp. 927-936.

Ho, Paul, et al., "Challenges of damascene etching for copper interconnect," *Proceedings of SPIE*, vol. 3883, 1999, pp. 34-41.

* cited by examiner

METHOD OF FILLING STRUCTURES FOR FORMING VIA-FIRST DUAL DAMASCENE INTERCONNECTS

RELATED APPLICATIONS

This application claims the priority benefit of a provisional application entitled METHOD OF FILLING STRUCTURES FOR FORMING VIA-FIRST DUAL DAMASCENE INTERCONNECTS, Ser. No. 60/504,368, filed Sep. 19, 2003, incorporated by reference herein.

BACKGROUND OF THE INVENTION

1. Field of the Invention

The present invention is concerned with new dual damascene methods utilizing a partial curing step, a solvent etching step, and a final curing step. These methods result in very thin, cured layers having low biases, even on highly topographic surfaces.

2. Description of the Prior Art

As integrated circuit devices grow smaller, there is an increasing need for multi-level interconnects of smaller size and improved feature integrity. The damascene integration scheme is one way to allow for increasing chip densities on a substrate as design rules continue to shrink integrated circuit devices. The damascene process eliminates the need to etch the metal layer that provides the interconnections, permits more densely spaced interconnects, and eliminates the need for dielectric gap-fill materials.

There are two general classes of damascene processes: single damascene and dual damascene. The single damascene process fabricates interconnections by forming a conducting plug through a dielectric layer to connect to the underlying conducting layer. Another dielectric layer is then formed, with the actual interconnect wiring metallization being patterned in the second layer. The dual damascene process constructs multi-level interconnects of smaller size than the single damascene process. The via and trench patterns are patterned into a single dielectric layer and then filled in one step with a conducting material such as a metal. Dual damascene processes involve fewer steps, resulting in smaller, more complex integrated circuit devices, thus lowering manufacturing complexity and cost.

Despite the advantages of dual damascene processes, patterning and etch processes are made more difficult because of feature topography and more complex stack layers. Several techniques have been developed to address such problems, including self-aligned dual damascene, trench-first dual damascene, and via-first dual damascene processes. The application of self-aligned dual damascene is limited, because it requires a thick, intermediate layer to act as an anti-reflective layer, nearly perfect trench and via alignment, and very high etch selectivity between the dielectric and etch-stop layers. Trench-first dual damascene processes involve first masking and etching the trench, and then aligning the via pattern with the newly etched trenches. Successful trench-first dual damascene processes require achieving very uniform trenches and maintaining critical dimension control of vias, which in turn requires high etch selectivity between the dielectric and etch-stop layers. The use of etch-stop layers may also increase the dielectric constant of the dielectric material, possibly leading to device failure.

Via-first dual damascene is a somewhat simpler technique, because the vias are formed on top of the full stack of layers. The vias are etched, followed by lithography processes to form the trench patterns. Via-first dual damascene requires a fill composition capable of protecting the bottom of the via during the trench etch step, and of planarizing the surface to allow easier trench patterning. Two techniques are commonly used in via-first dual damascene processes: partial fill and full fill. In partial fill processes, the gap-fill material protects only the bottoms of the via holes, requiring consistent coverage and depth control. In full-fill processes, the vias are completely filled and the layer is planarized. The etching process is performed on the top layer. During photoresist patterning steps, it is necessary to control reflections from underlying materials through use of an anti-reflective coating to prevent distortion of the photoresist pattern. If the gap-fill material lacks suitable light-absorbing properties, trench patterning usually requires incorporating an anti-reflective coating into the stack as a hardmask layer, or coating an anti-reflective layer over the gap-fill material before applying the photoresist. These extra layers complicate the process and increase manufacturing costs.

A typical via-first dual damascene process is illustrated in FIG. 1. A dielectric layer (10) is deposited onto a substrate (12) with a conductive layer (14). A gap-fill material without light-absorbing properties (16) has mostly filled the vias (17). A hardmask layer (18) and a bottom anti-reflective coating (20) are applied for reflection control for the patterned photoresist (22) to permit the trench to be etched into the dielectric layer (10).

Using a gap-fill material with good light-absorption and planarizing properties would simplify the process, but conventional organic bottom anti-reflective coatings do not display these properties. Coating properties of bottom anti-reflective coatings vary based on feature density and size. Differences in feature density result in iso-dense bias, in which the depth of the bottom anti-reflective coating is greater in isolated device features than in dense device features. The use of very thick bottom anti-reflective coatings addresses this problem, but requires a troublesome blanket-etch step to planarize the layer and reduce its thickness to more useful levels before the photoresist layer can be applied and patterned. This requires additional manufacturing steps, and may require wafers to be transferred between the etch and lithography bays during manufacturing. Thick coatings also require a high etch selectivity between the photoresist and the bottom anti-reflective coating, which may not be possible because of the etch chemistry or the photoresist and bottom anti-reflective coating chemistries. FIG. 2 shows a dielectric layer (24) with via openings (26) formed over a substrate (28) with a conductive layer (30) that has been coated with a conventional, gap-fill, bottom anti-reflective coating (32). FIG. 2 illustrates the poor fill in the dense areas, nonuniform fill (34), and voids in the bottom anti-reflective coating (36).

Blanket etch steps can also leave debris remaining in device features after etching steps, which can lead to poor electrical connections and device failure. Removal of such debris may require the use of time-consuming, wet-cleaning techniques, and despite this, debris may still remain. Thick bottom anti-reflective coatings can also result in a fence problem in trenches and vias. The bottom anti-reflective coating and the dielectric material undergo a chemical reaction when in contact with one another, forming a thin residue inside the vias. The residue can cause incomplete trench etch, leading to poor device feature integrity. In view of the difficulties in the via-first dual damascene process, a method of using bottom anti-reflective coatings that would reduce the number of steps required in fabrication, eliminate the debris and the fence problems, and result in a more consistent fill of dense and isolated device features is greatly needed.

SUMMARY OF THE INVENTION

The present invention is broadly concerned with a new method for forming dual damascene structures. The inventive methods comprise applying (e.g., by spin coating) a composition to a substrate so as to form a layer of that composition on the substrate surface. The composition layer is then partially cured, and a solvent is puddled on the partially cured layer. The solvent is removed (e.g., by spinning) from the partially cured layer, and the layer is further cured to yield a thin layer with very low bias.

In more detail, the substrate utilized will preferably include topography (e.g., contact holes, via holes, raised features, trenches). This topography can be included directly on the substrate surface, or it can be included in one or more layers of other material formed on the substrate surface. The substrate can be any microelectronic substrate. Preferred substrates include those commonly used in dual damascene structures, with particularly preferred substrates being selected from the group consisting of silicon, aluminum, tungsten, tungsten silicide, gallium arsenide, germanium, tantalum, tantalum nitrite, and SiGe.

The composition utilized can be any suitable crosslinking composition, including conventional anti-reflective coating and/or gap-fill compositions. These compositions will typically include a polymer binder, a crosslinking agent (as a separate component or built into the polymer binder), a catalyst, and other optional ingredients dissolved or dispersed in a solvent system. This composition can be applied to the substrate at any number of average thicknesses depending upon the final use, but will typically be initially applied at thicknesses of from about 200-300 nm.

After application to the substrate, the composition is partially cured. That is, the composition is less than about 90% cured, and preferably from about 40-60% cured. This is typically carried out by heating the composition. The most preferred curing method involves heating the composition at a temperature of from about 65-95%, preferably from about 70-90%, and more preferably from about 78-88% of the composition's curing temperature. With many currently available compositions, this temperature will be from about 140-180° C., and preferably from about 150-165° C. This heating step is preferably carried out for a time period of from about 15-90 seconds, more preferably from about 30-80 seconds, and even more preferably from about 50-70 seconds.

After the composition layer has been partially cured, it is preferred that the layer be cooled or chilled. This is preferably accomplished by simply exposing the layer to room temperature (e.g., 20-25° C.), preferably for a time period of from about 20-40 seconds, and more preferably from about 25-35 seconds.

Next, a solvent is puddled onto the layer. Preferred solvents include those selected from the group consisting of ethyl lactate, propylene glycol monomethyl ether (PGME), propylene glycol monomethyl ether acetate (PGMEA), and mixtures thereof. The solvent is preferably allowed to contact the layer for a time period of from about 10-60 seconds, preferably from about 15-55 seconds, and more preferably from about 20-45 seconds. The solvent is then removed from the substrate, preferably by spinning at a speed of from about 1,500-2,500 rpm for a time period of from about 20-40 seconds.

After solvent removal, the layer of composition is then subjected to a final curing step. During this step, the layer is heated to a sufficient temperature and for a sufficient time so as to at least substantially (i.e., at least about 98%), and preferably completely, cure the layer. This will typically involve heating the layer to a temperature of from about 195-250° C., and more preferably from about 205-225° C. The typical heating time will be from about 30-90 seconds, more preferably from about 40-80 seconds, and even more preferably from about 55-65 seconds.

When comparing the thickness of the layer after partial curing and prior to solvent contact to the thickness of the layer after the final curing step, it can be seen that the solvent contact step results in the composition being at least partially removed. Preferably, the solvent contact step etches the composition at a rate of from about 40-80 Å of thickness per second of solvent contact, and more preferably from about 50-70 Å of thickness per second of solvent contact.

The inventive process can be used in both partial fill (i.e., where about 35-65% of the hole's depth is filled with the composition) and full-fill (i.e., where at least about 95%, and preferably about 100% of the hole's depth is filled with the composition) applications. Furthermore, it will be appreciated that the inventive methods can be used to form dual damascene structures possessing properties not previously achieved. For example, the structures prepared according to the inventive methods will have low biases, even with very thin layers of the composition. Specifically, the inventive methods will result in layers having biases of less than about 80 nm, preferably less than about 65 nm, more preferably less than about 50 nm, and even more preferably from about 0-35 nm. Furthermore, the layers will have average thicknesses of less than about 100 nm, preferably less than about 80 nm, and more preferably less than about 70 nm. Unlike prior art methods, these properties can be achieved using the same composition. That is, the same composition can be used to fill the contact and via holes as is used to form a layer on the surface of the substrate. This dramatically improves processing conditions.

As used herein, the average thickness of a layer is determined by measuring (with an ellipsometer or other conventional device) the thickness of a layer at a point about halfway between two via holes: (1) that are not separated from one another by an intervening feature; and (2) whose boundaries are within 1,000 nm of one another. These measurements are repeated over a wafer (or other area as defined herein) up to 49 times, and the measurements are averaged to determine the average thickness of a layer.

As used herein, the bias is determined by subtracting the average thickness of a layer over a dense region from the average thickness of that same layer over an isolated region. A dense region is defined as a portion of a substrate that has at least about 50% of its surface area filled with via holes, while an isolated region is defined as a portion of a substrate that has less than about 20% of its surface area filled with via holes.

DETAILED DESCRIPTION OF THE PREFERRED EMBODIMENTS

The present inventive methods can be used to both create a more planar topography for trench patterning, and to protect the bottom of a via hole from damage during the trench etch process.

Figure 1:
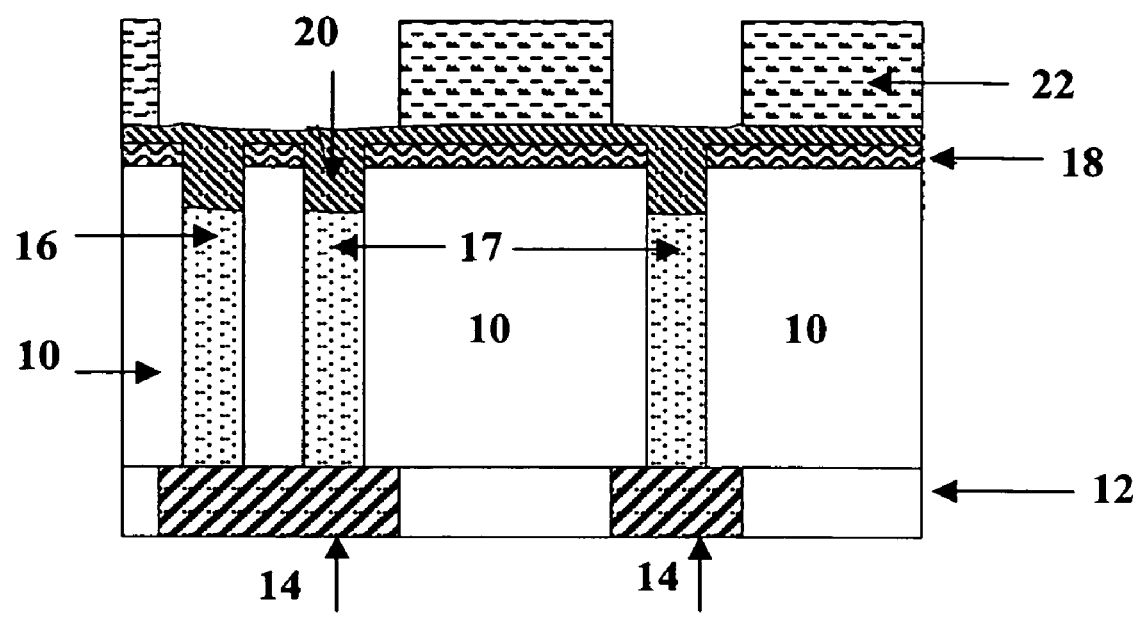
FIG. 1 is a schematic drawing showing prior art, via-first, dual damascene layers using a gap-fill material without light-absorbing properties.
Figure 2:
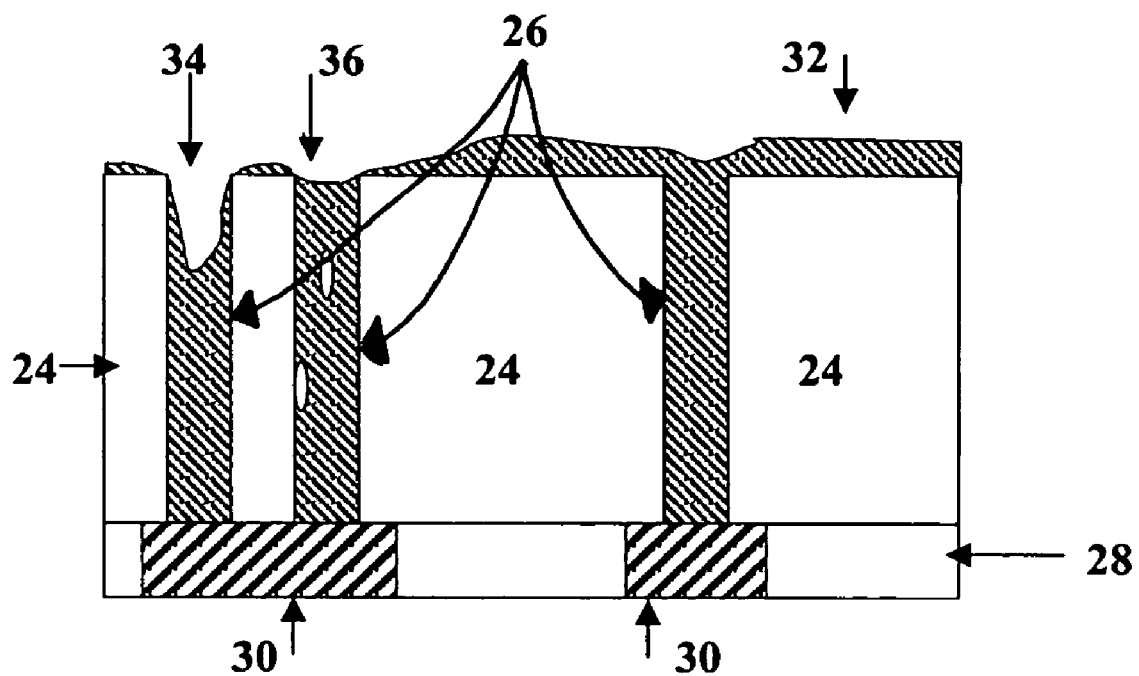
FIG. 2 is a schematic drawing illustrating the gap-fill properties of prior art organic bottom anti-reflective coatings.
Figure 3A:
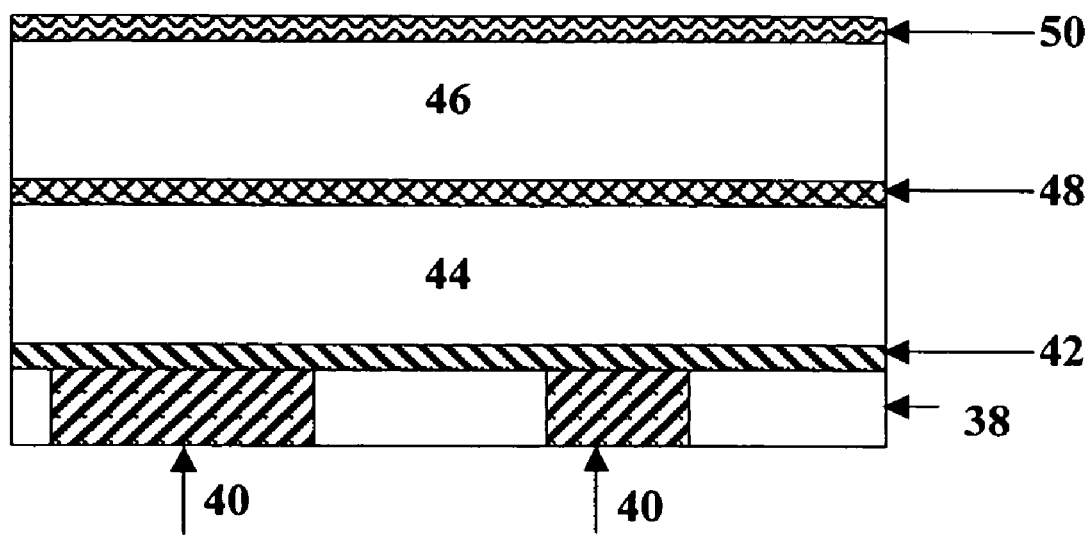
FIGS. 3a-i are schematic drawings showing successive steps in a dual damascene process using the inventive methods.

FIGS. 3a-3i illustrate one embodiment of the invention in more detail. As shown in FIG. 3a, a substrate (38) with a conductive structure (40) is provided. The substrate (38) includes any suitable semiconductor material in any stage of device processing that needs an interconnect. The conductive material (40) is any structure to which an electrical contact is desired (e.g., a metal line). An optional cap layer (42) is formed on the substrate (38) to prevent diffusion of metal into the overlying layers. Next, dielectric layers (44, 46) are formed with an optional, intervening etch-stop layer (48) formed of a suitable material (e.g., silicon nitride). The etch stop layer (48) serves to stop a trench etch. The dielectric layers may be formed from any suitable materials (e.g., silicon dioxide). Another embodiment omits the etch stop layer (48), and only one dielectric layer is formed on the substrate (38) in which the dual damascene structure is formed. Another optional cap layer (50) made of a material similar to the first cap layer (42) may be deposited on the top dielectric layer (46) to prevent metal diffusion into the underlying layers. This layer may also serve as a hardmask or etch stop for partial via fill applications.

Figure 3B:
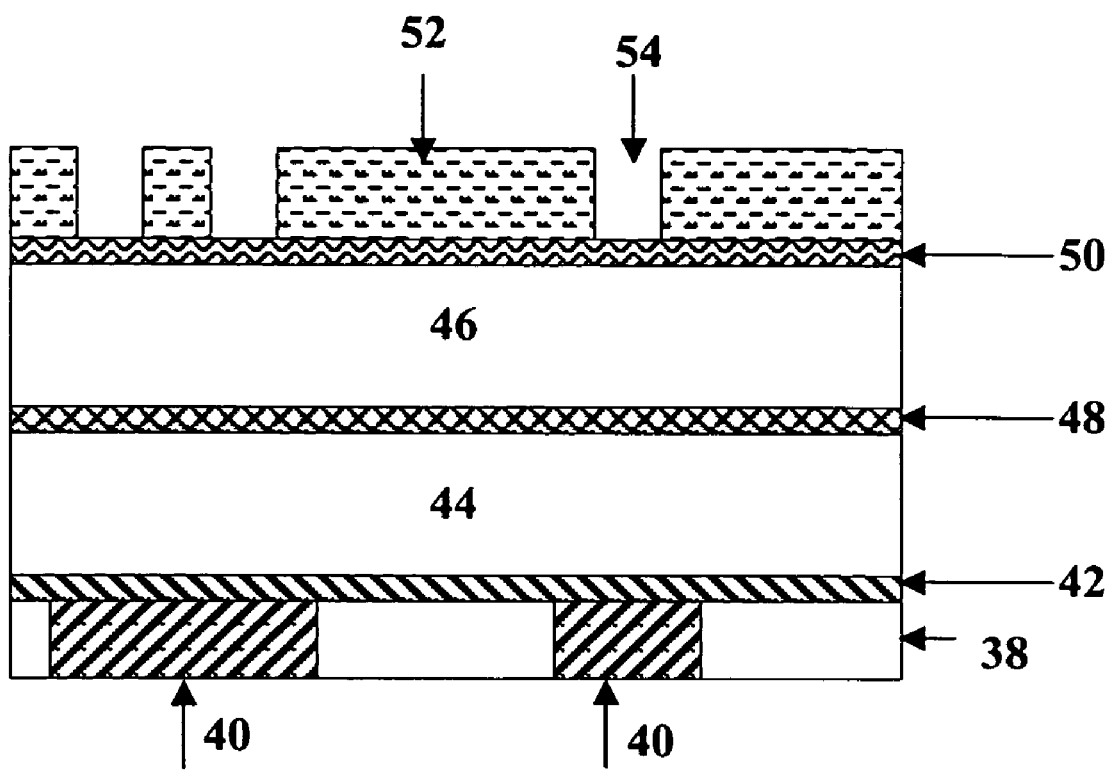
Figure 3C:
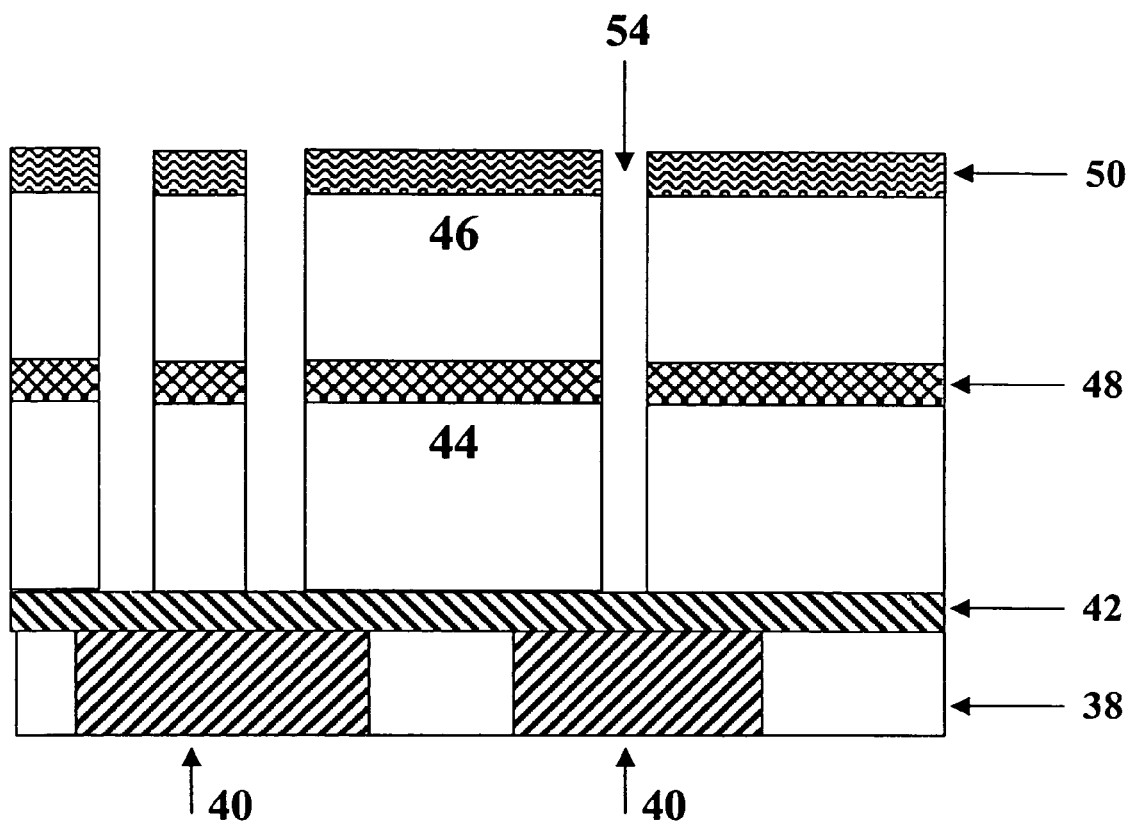

In FIG. 3b, a patterned photoresist (52) is formed on the optional cap layer (50). This patterned photoresist (52) defines the first via opening (54). After the via opening (54) is formed, the cap layer (50), the dielectric layer (46), the etch stop layer (48), and the dielectric layer (44) are etched to transfer the via opening (54) into the respective layers and expose the cap layer (42), as shown in FIG. 3c. The cap layer (42) may then be etched to expose the underlying conductive layer (40). In another embodiment, the via is etched through the cap layer (50) and the dielectric layer (46) and stops at the etch stop (48). The etch stop may also be etched in some applications.

Figure 3D:
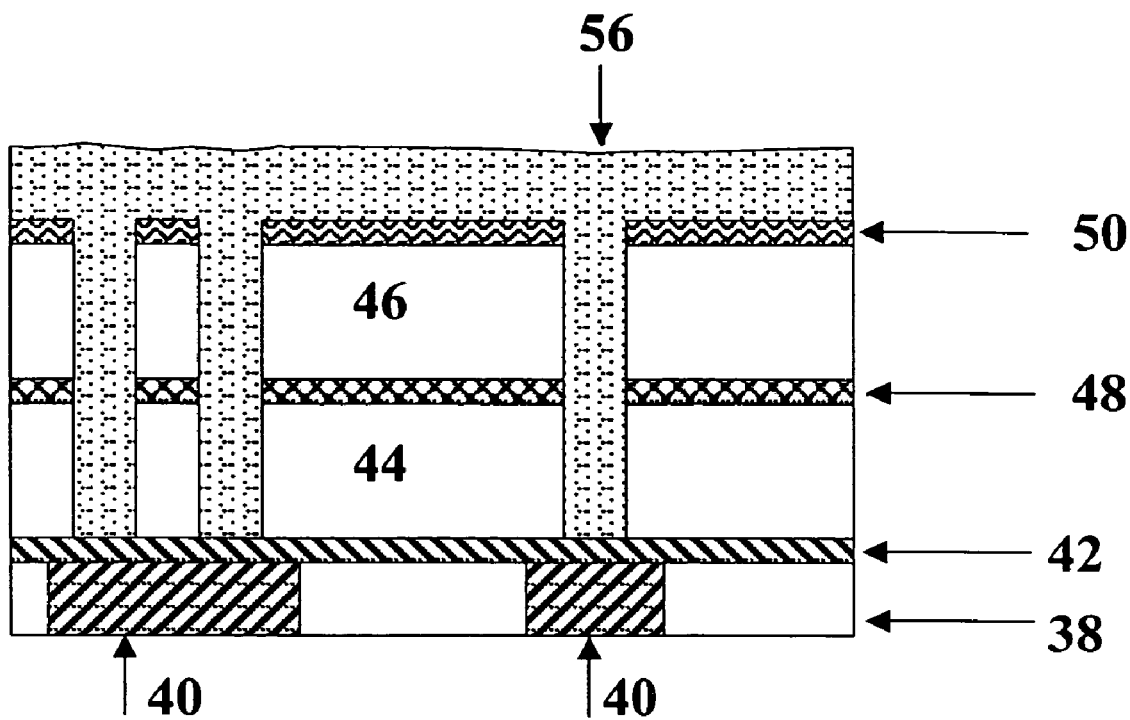
Figure 3E:
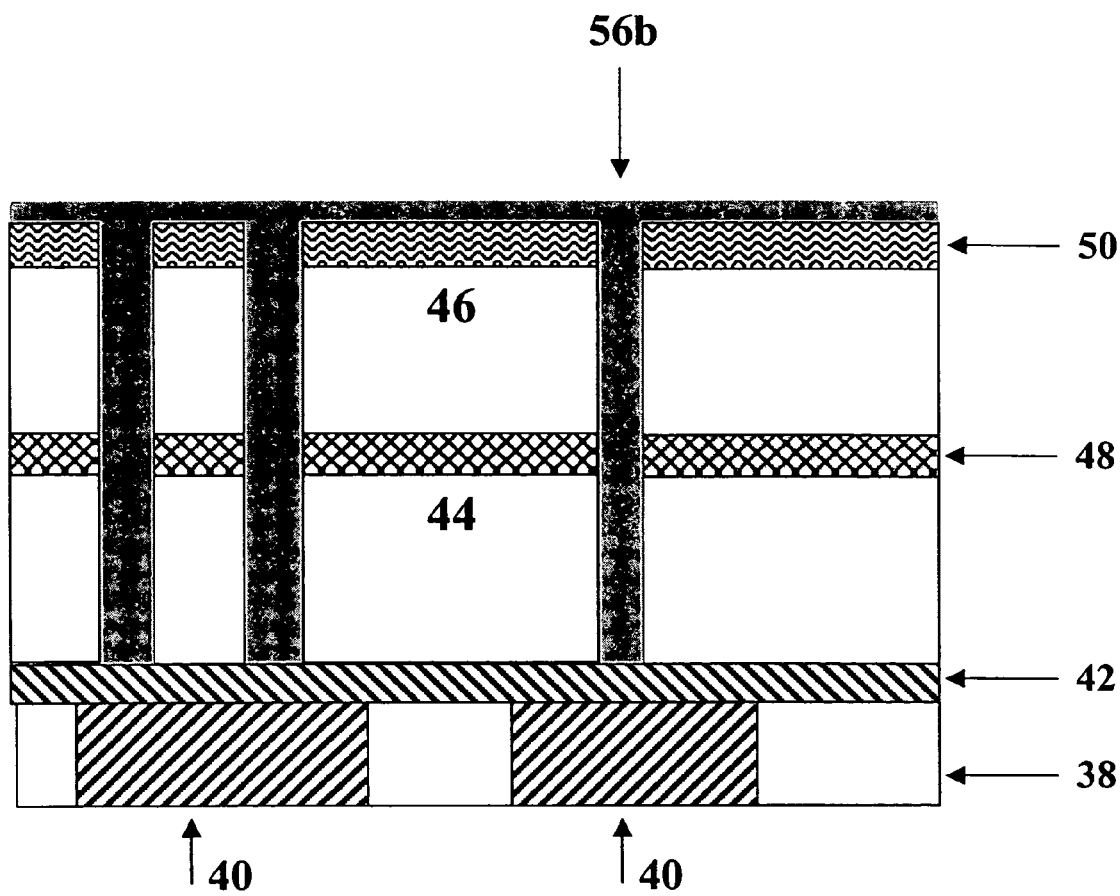
Figure 3F:
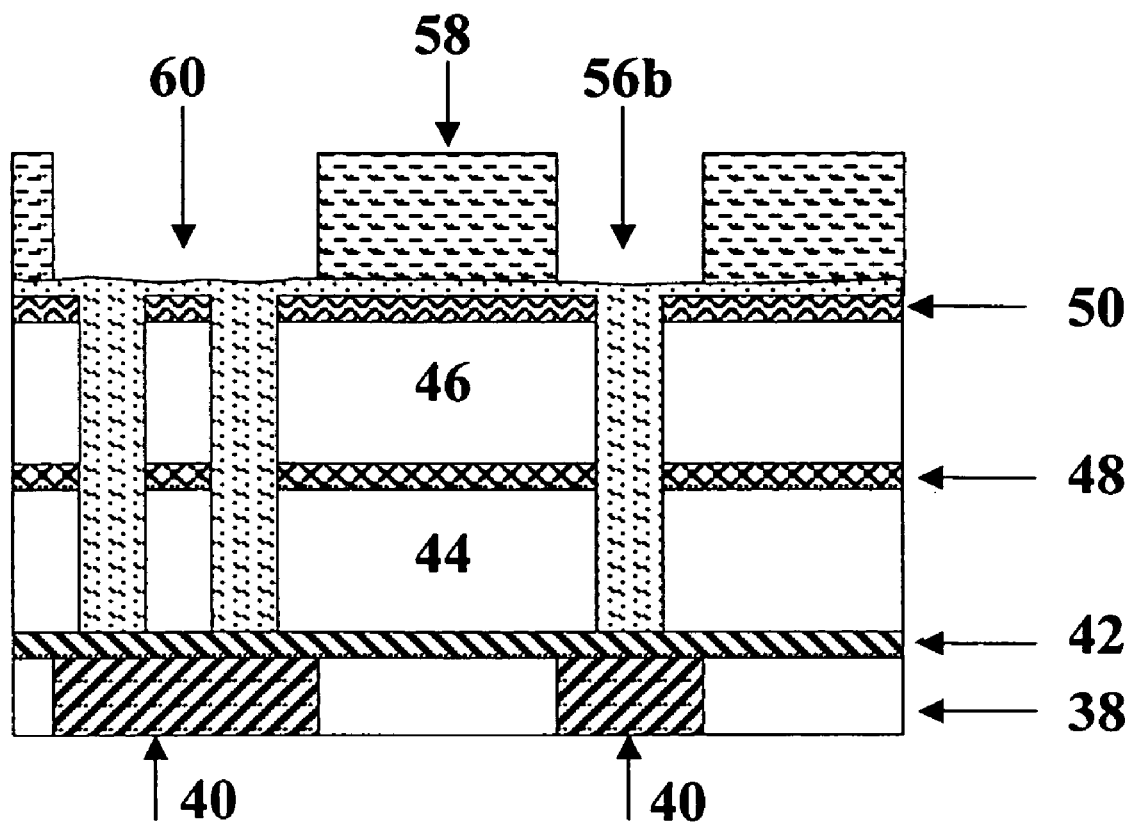

A thick, gap-fill, bottom anti-reflective coating (56) is applied to the top cap layer (50) and fills the vias. The gap-fill, bottom anti-reflective coating (56) should be thick enough to completely planarize the topography, which occurs when the bottom anti-reflective coating (56) thickness is greater than about 150 nm, as shown in FIG. 3d. The bottom anti-reflective coating (56) is then partially cured and a solvent (e.g., PGMEA, ethyl lactate, PGME) is applied to the bottom anti-reflective coating (56). The solvent removes a portion of the film determined by both the time the solvent is in contact with the bottom anti-reflective coating (56) and the partial curing process. The solvent is then removed, and the bottom anti-reflective coating is fully cured (56b), as shown in FIG. 3e. The resulting bottom anti-reflective coating (56b) thickness on the cap layer (50) is optimized to give maximum reflection control over that substrate stack. In another embodiment, the bottom anti-reflective coating (56) is removed so that only a portion remains in the vias to protect the bottom of the vias. Then a second patterned photoresist (58) is formed on top of the fully cured bottom anti-reflective coating (56b). The pattern forms the trench (60), as shown in FIG. 3f.

Figure 3G:
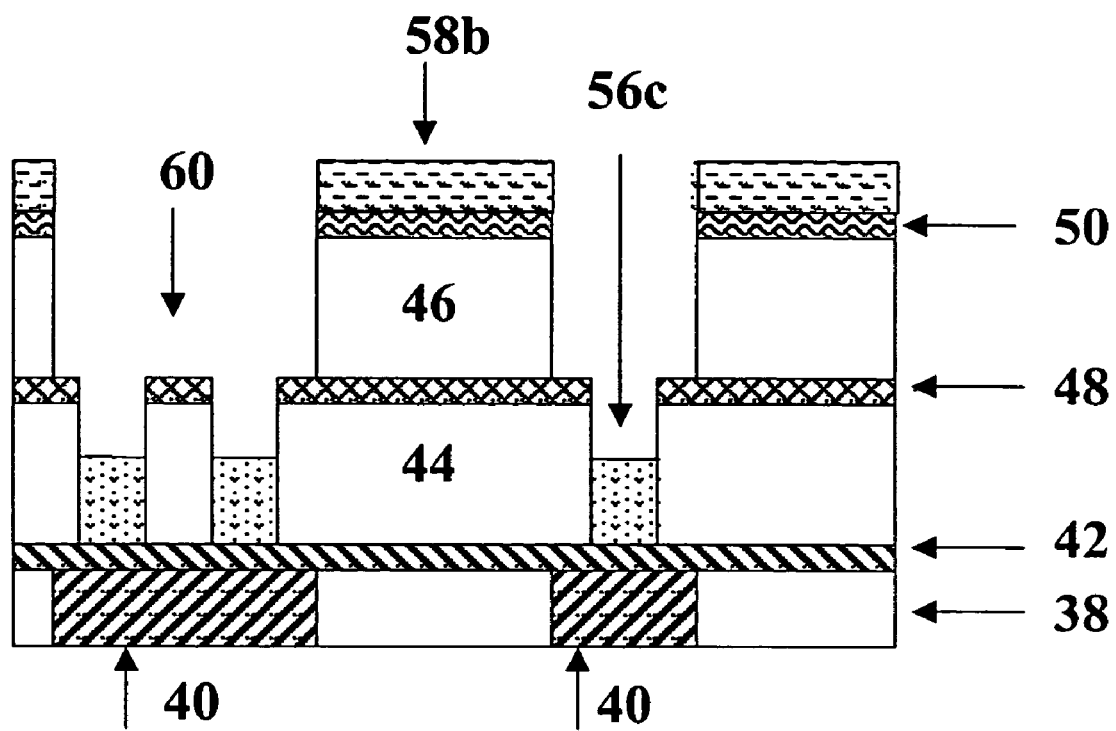

Next, the trench pattern (60) is transferred into the cap layer (50), and the dielectric layer (46) by etch, ending at the etch stop (48). The gap-fill, bottom anti-reflective coating (56b) will be etched away concurrently, and the bottom anti-reflective coating (56c) will be left in the via after the trench etch. The patterned photoresist (58b) will be partially removed, but may be completely removed depending upon the etch chemistry. The cap layer (50) acts as a hardmask or etch stop, as shown in FIG. 3g.

Figure 3H:
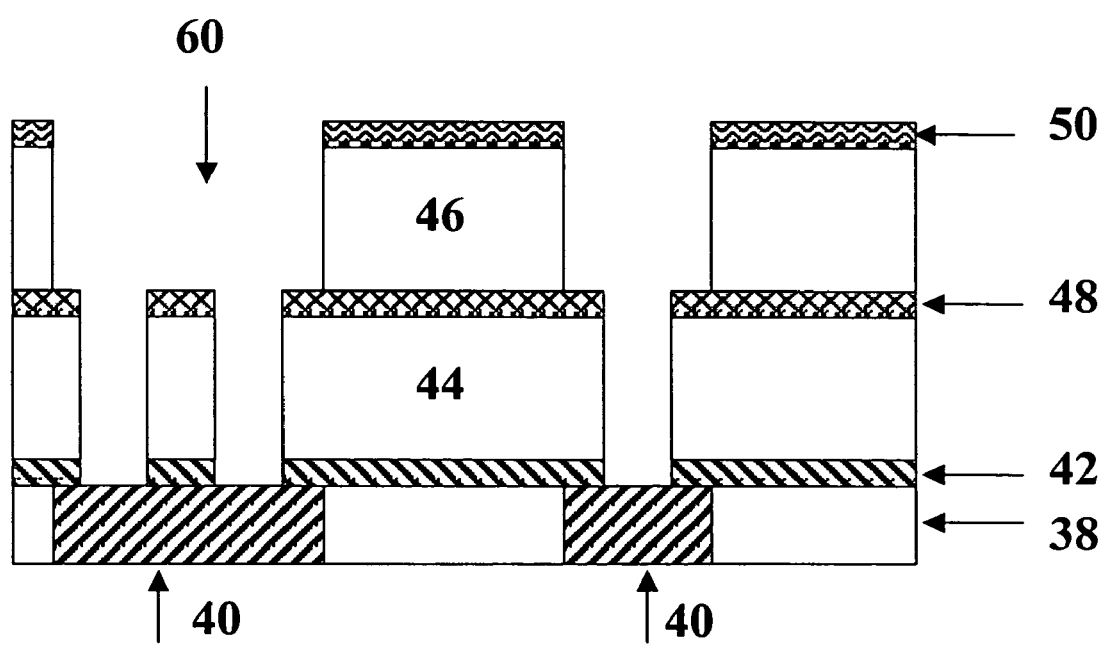

The remaining patterned photoresist (58b) and bottom anti-reflective coating (56c) are removed with a conventional ashing process and/or wet cleaning process (e.g., ozonated water, acid bath), and the cap layer (42) is etched to expose the conductive layer (40). The etch stop layer (48) may be removed at the same time, as shown in FIG. 3h.

Figure 3I:
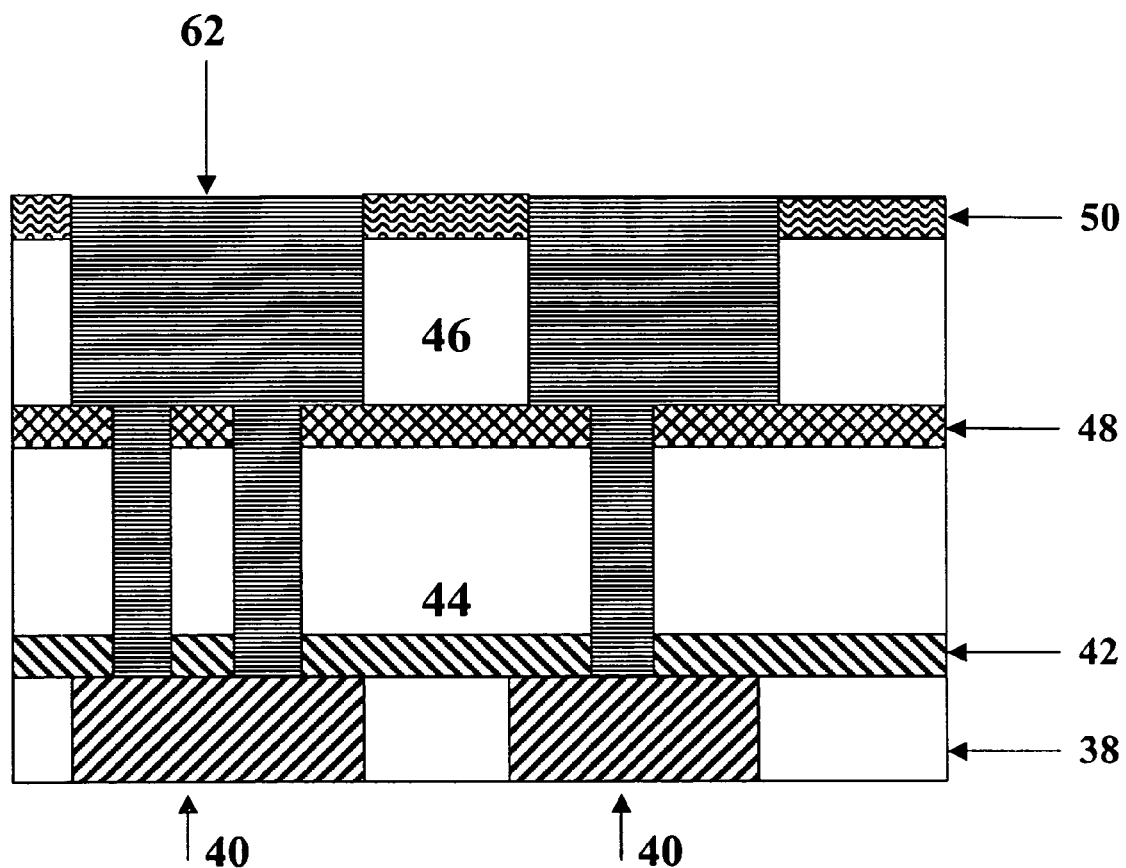

A conductive (e.g., metal) layer (62) in the dual damascene interconnect structure is then formed in the dielectric layer (46) and the via opening in the dielectric layer (44), as shown in FIG. 3i. The conductive layer (62) is made by forming a layer that is electrically continuous with the conductive layer (40). The conductive layer (62) is planarized with the cap layer (50), or with the dielectric layer (46) if the cap layer (50) is removed. An optional barrier layer (not shown) may be deposited on the sidewalls of the via to serve as a diffusion barrier before the conductive layer (62) is deposited.

EXAMPLES

The following examples set forth preferred methods in accordance with the invention. It is to be understood, however, that these examples are provided by way of illustration and nothing therein should be taken as a limitation upon the overall scope of the invention.

Example 1

Full-Fill Application Using PGMEA as a Solvent

Figure 4:
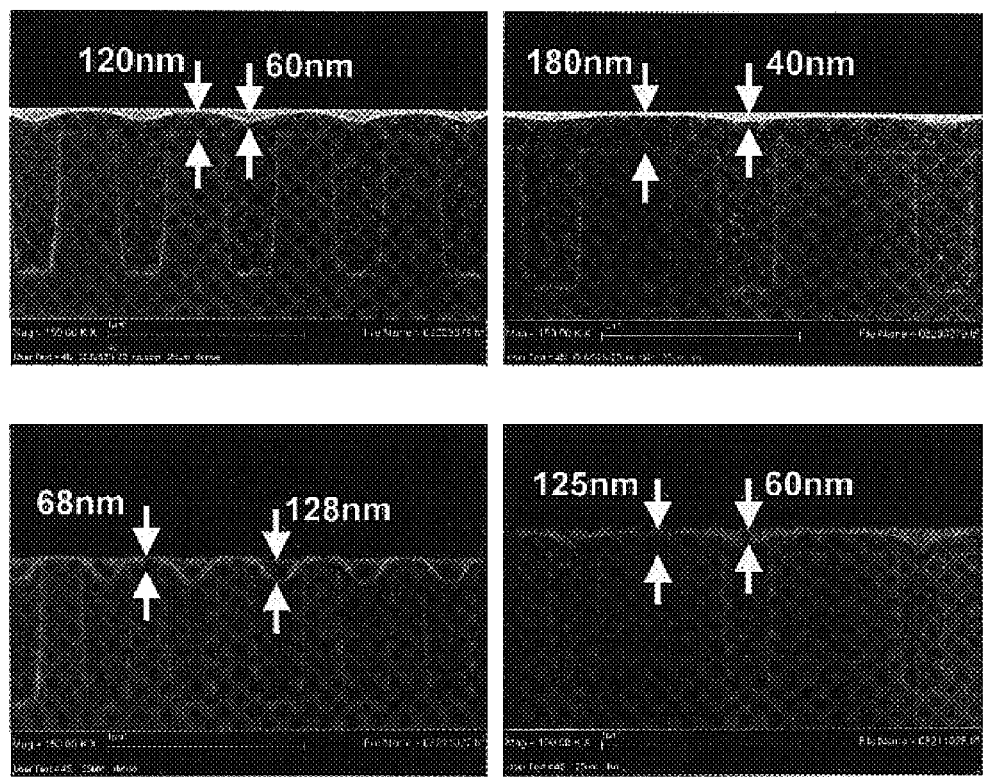
FIG. 4 is a Scanning Electron Microscope (SEM) photograph showing a cross-sectional view of the samples of Example 1, before and after the etch-back process.

DUV52N (available from Brewer Science Inc., Rolla, Mo.) was coated on a wafer with etched via arrays having various pitches and diameters. The coated wafer was then baked at 140° C. for 130 seconds, partially curing the layer of DUV52N. The wafer was then cooled at 21° C. for 30 seconds. PGMEA was puddled onto the wafer for 35 seconds, and the wafer was then spun at 2,000 rpm for 30 seconds to remove the solvent. A final bake at 205° C. for 60 seconds completely cured the layer of DUV52N. An SEM photograph (FIG. 4) revealed that the thickness of layer of DUV52N before the solvent etch step was 120 nm in a 250-nm diameter, 1:1 via array, and 180 nm thick in a 250-nm isolated pitch via array, yielding a bias of 60 nm. After the solvent etch step, the thickness was reduced to 68 nm in the dense array, and 125 nm in the isolated array, resulting in a bias of 57 nm.

Example 2

Partial-Fill Application Using PGME as a Solvent

DUV52N was coated onto a via array and baked at 160° C. for 60 seconds to partially cure the bottom anti-reflective coating layer. The wafer was then cooled at 21° C. for 30 seconds. PGME was puddled onto the wafer for 15 seconds. The wafer was then spun at 2,000 rpm for 30 seconds to remove the solvent, and then underwent a final curing step by baking at 205° C. for 60 seconds. Before the solvent etch step, the thickness of DUV52N was 174 nm in the dense via array and 190 nm in the isolated via array, reflecting a bias of 16 nm. After the solvent etch-back and final cure steps, the bottom anti-reflective coating was found only at the bottom of the vias. The thickness of the bottom anti-reflective coating remaining in the vias was 52 nm in the dense via array, and 120 nm in the isolated via array, a bias of 78 nm.

Example 3

Partial-Fill Application Using PGME as a Solvent

DUV52N was coated onto a via array and baked at 160° C. for 60 seconds. The wafer was then cooled at 21° C. for 30 seconds. PGME was puddled onto the wafer for 45 seconds. The wafer was then spun at 2,000 rpm for 30 seconds to remove the solvent, and underwent a final cure step by baking at 205° C. for 60 seconds. Before solvent etch, the thickness of the DUV52N was 174 nm in the dense via array, and 190 nm in isolated via array, a bias of 16 nm. After the solvent etch-back and final cure steps, the bottom anti-reflective coating was found only at the bottom of the vias at a thickness of 30 nm in the dense via array, and 90 nm in the isolated via array. This resulted in a bias of 60 nm.

Example 4

Comparative Via-Fill Material

DUV52 (available from Brewer Science Inc., Rolla, Mo.) was applied to a via array, resulting in a layer of the same thickness (140 nm) as DUV52N after the solvent etch-back step. In a full-fill process, the thickness of DUV52 was 128 nm in isolated via arrays, and 12 nm in dense via arrays. This resulted in a bias of 116 nm, much larger than 57 nm, the bias of the full-fill solvent etch-back process described in Example 1. The solvent etch-back process reduced the thickness bias across via arrays by at least 50% in full via-fill processes. In a partial-fill process, the DUV52 isolated-dense array bias was 81 nm on top of the oxide and 274 nm inside the vias. As compared with traditional bottom anti-reflective coating via-fill methods, the method of Examples 2 represents a 72% reduction in isolated-dense via bias.

Figure 5:
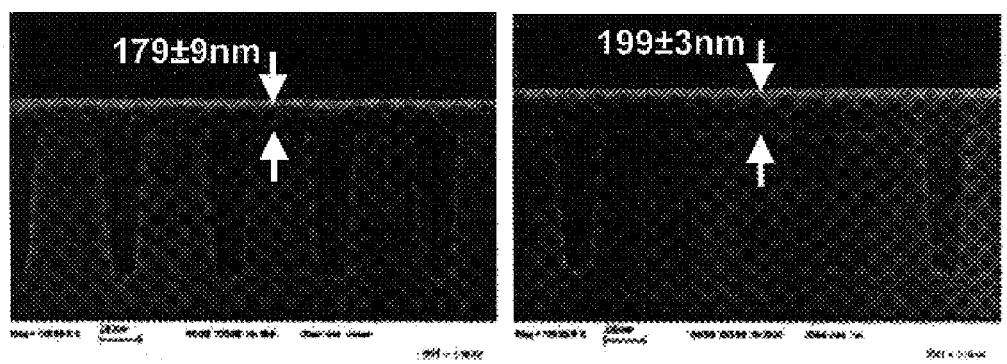
FIG. 5 is an SEM photograph showing a cross-sectional view of a control sample.

FIG. 5 depicts another comparative sample where DUV52N was the composition utilized. No solvent etch-back step was carried out. Instead, the DUV52N was baked at 205° C. for 60 seconds. The via depth was 700 nm, and the via diameter was 250 nm. The bias was about 20 nm, and the thickness was greater than 180 nm.

Example 5

Figure 6:
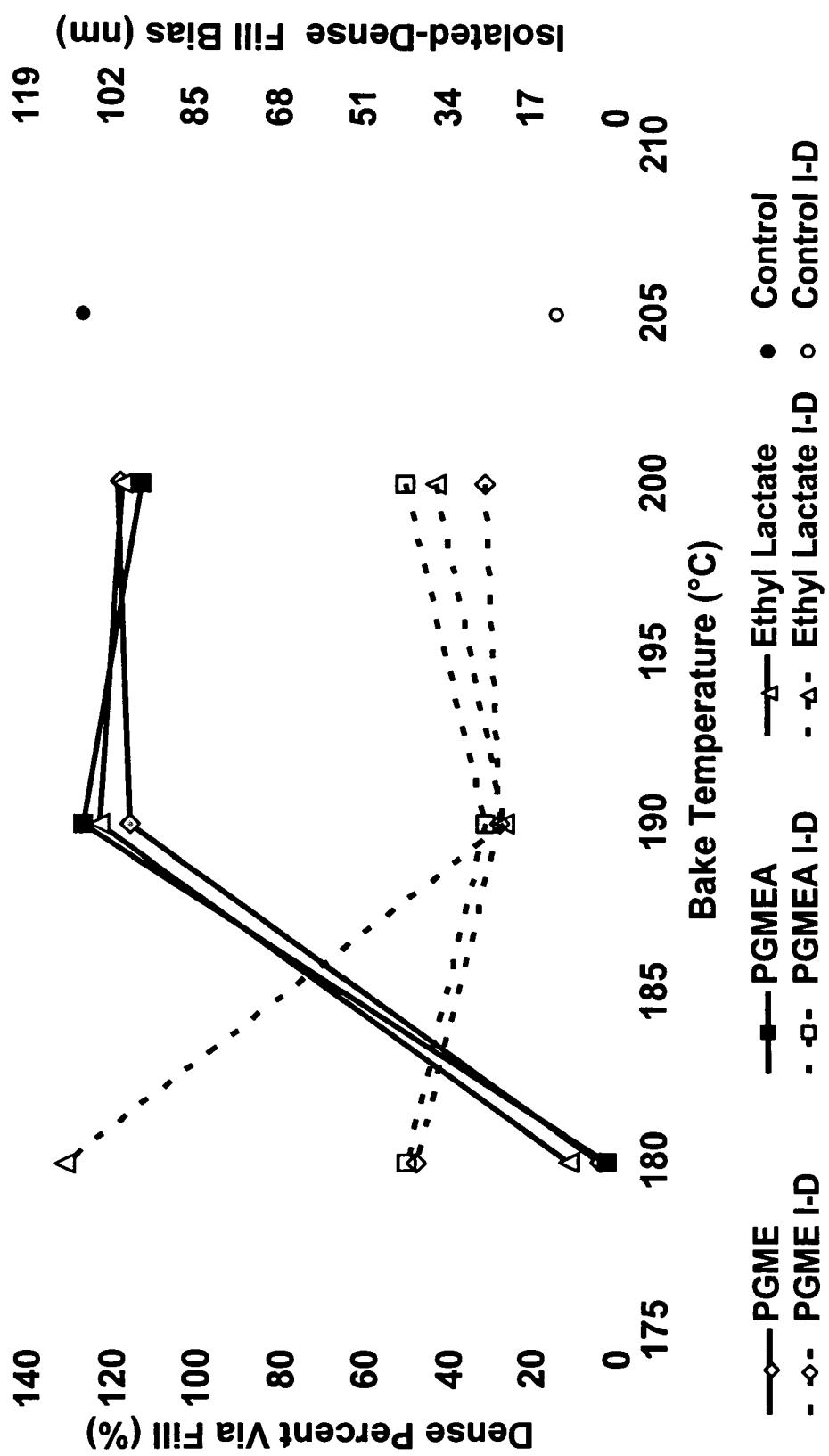
FIG. 6 is a graph comparing different solvents used in the inventive methods.

This procedure was carried out to compare the use of different solvents (PGME, PGMEA, and ethyl lactate) during the solvent etch-back step. For each solvent, a bake matrix for the partial cure step was performed to determine whether different solvents would change the etch rate significantly. The final bake was carried out at 205° C. The bake times for both bakes were fixed at 60 seconds, and the solvent puddle was fixed at 30 seconds for purposes of this procedure. The wafer was cooled at 21° C. for 30 seconds prior to solvent contact, and after solvent contact, the solvent was removed at 2,000 rpm for 30 seconds. From the solid lines in FIG. 6, which is the dense via fill percentage, it can be seen that the etch rates in the vias were very similar and almost identical. The dashed line represents the isolated-dense fill bias in nanometers. The biases between solvents were similar, and were typically from about 30-40 nm. Also, these results indicate that the most preferred process window for partial via fill applications is from about 180-190° C.

Example 6

Applications Using Ethyl Lactate

In this procedure, the bake time was varied from 15-120 seconds, depending upon the bake temperature (varied from 180-190° C.), and the bake temperature was stepped at a finer increment. DUV52N was the composition used. The remaining conditions were: cooling at 21° C. for 30 seconds; 30-second solvent puddle; solvent removal at 2,000 rpm for 30 seconds; and final bake at 205° C. for 60 seconds.

Figure 7:
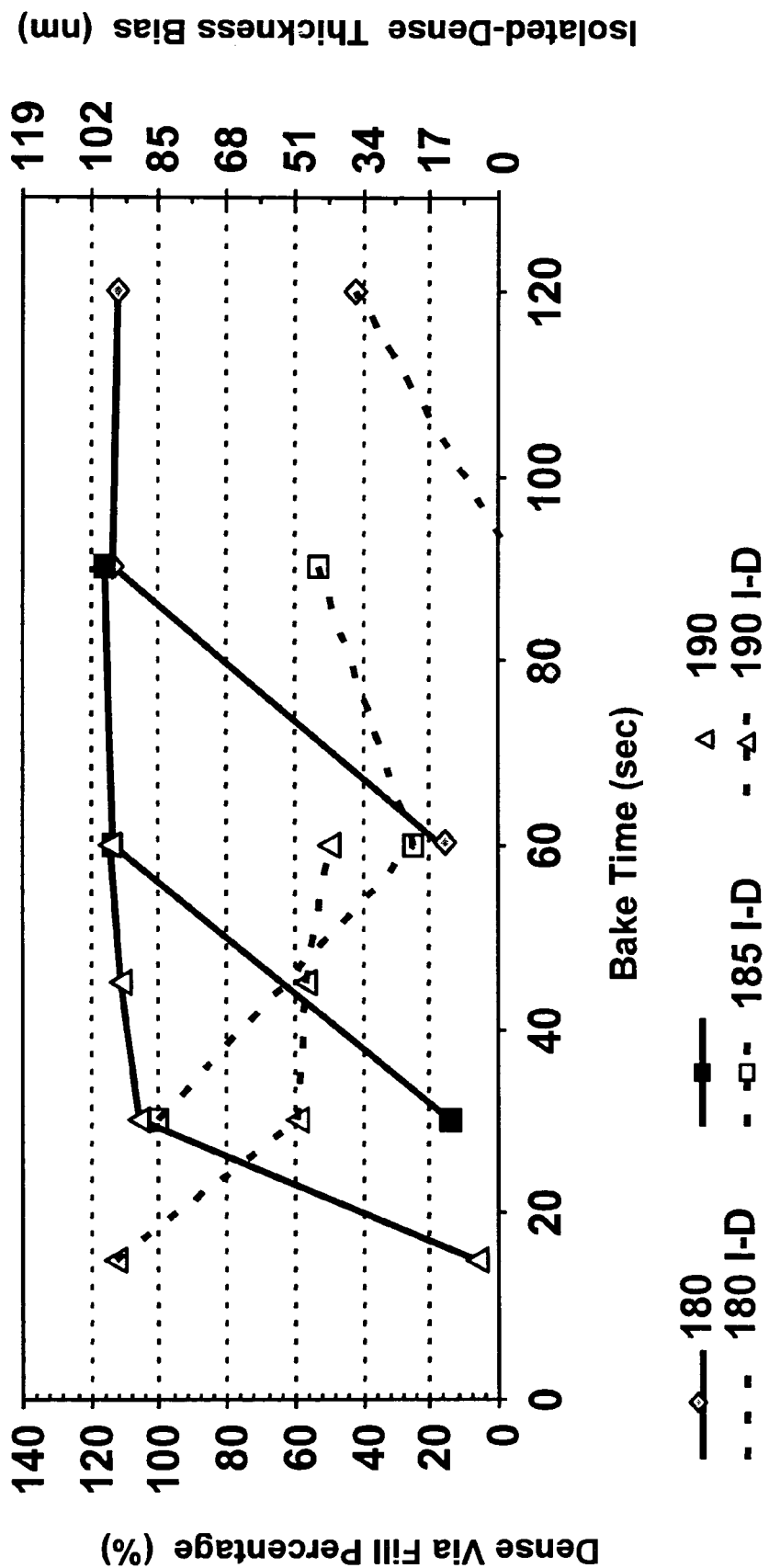
FIG. 7 is a graph showing via fill data in an inventive process where ethyl lactate was used in the solvent etch-back step.

Referring to the via fill percentages in FIG. 7, the lower the bake temperature, the longer the material must be baked to yield identical results. For example, full fill or 100% fill was achieved at 190° C. at about a 30-second bake time, and the 180° C. temperature required about a 90-second bake time.

Figure 8:
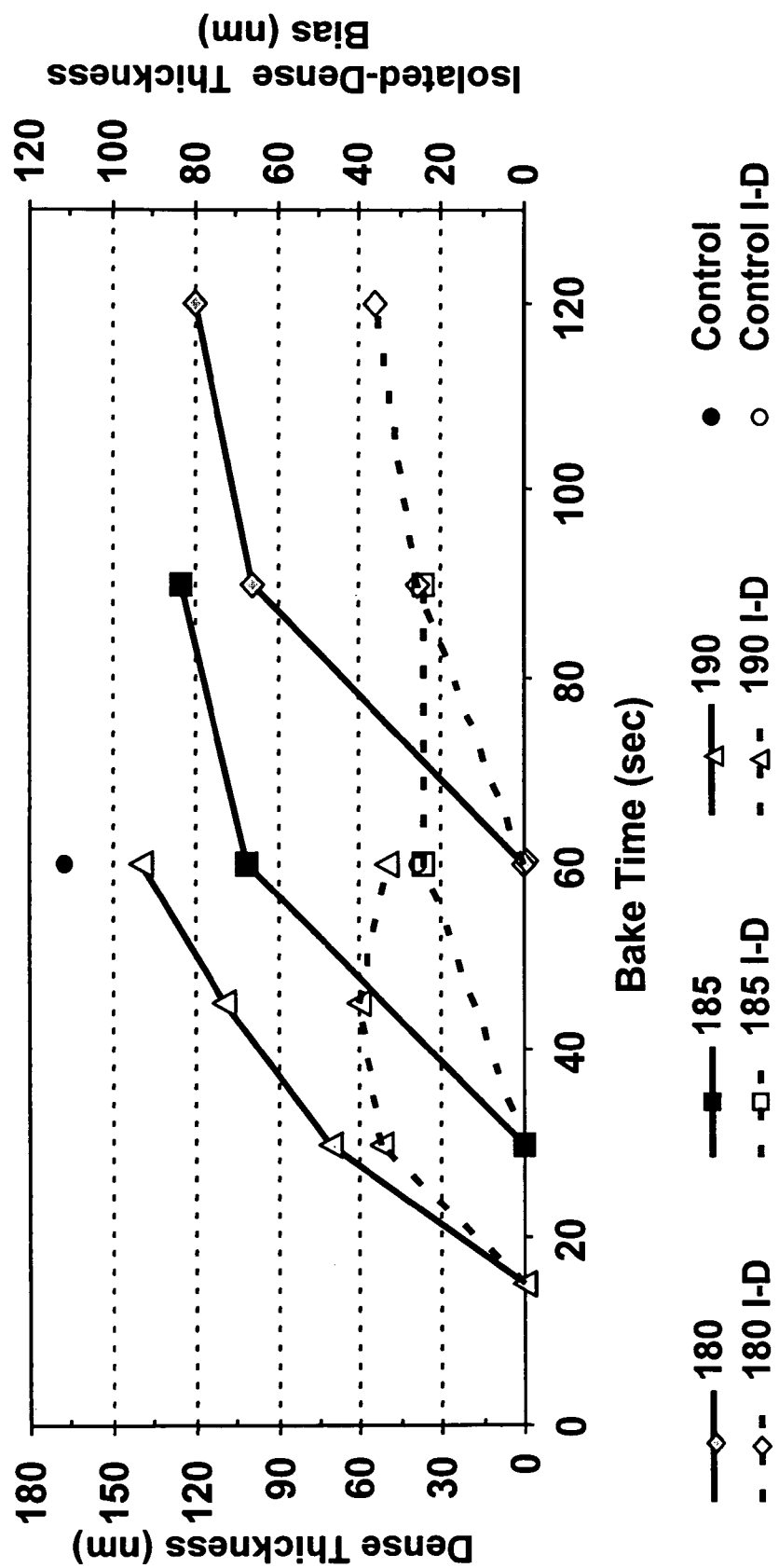
FIG. 8 is a graph showing thickness data in an inventive process where ethyl lactate was used in the solvent etch-back step.

FIG. 8 shows the dense thickness. The thickness of the bottom anti-reflective coating on top of the wafer surface was varied by the bake temperature and time. With an iso-dense bias of about 40 nm or less, and at a thickness of only about 60 nm, significant improvement for etch uniformity and etch bias was observed. Also, the reduced bias over conventional processes allows for larger photolithography windows. At the same time, the best thickness for a respective substrate can be utilized, and the thickness can be adjusted independent of equipment spin-speed limitations.

In this example, the data were generated using ethyl lactate, however, similar results were achieved with other solvents.

We claim:

1. A method of preparing a dual damascene structure, said method comprising the steps of:
   providing a substrate having a surface and comprising a plurality of topography features forming a dense region and an isolated region on said substrate;
   applying a composition to at least some of said topography features;
   partially curing said composition;
   contacting a solvent with the partially cured composition so as to remove some of the partially cured composition; and
   subjecting the partially cured composition to a second curing step, wherein after said second curing step, said composition is in the form of a layer on said topography features, wherein the difference between the average thickness of the layer over the isolated region and the average thickness of the layer over the dense region is less than about 80 nm.

2. The method of claim 1, wherein said substrate is selected from the group consisting of silicon, aluminum, tungsten, tungsten silicide, gallium arsenide, germanium, tantalum, tantalum nitrite, and SiGe.

3. The method of claim 1, wherein said composition has a curing temperature, and said partially curing step comprises heating said composition at a temperature that is from about 65-95% of said curing temperature.

4. The method of claim 1, wherein said partially curing step results in said composition being less than about 90% cured.

5. The method of claim 3, wherein said composition is heated for a time period of from about 15-90 seconds.

6. The method of claim 3, wherein said composition is heated at a temperature of from about 140-180° C.

7. The method of claim 1, wherein said composition comprises a layer after said applying step, and said contacting step comprises puddling a solvent on said layer.

8. The method of claim 1, wherein said contacting step comprises contacting a solvent with said composition for a time period of from about 10-60 seconds.

9. The method of claim 1, wherein said solvent is selected from the group consisting of ethyl lactate, propylene glycol monomethyl ether, propylene glycol monomethyl ether acetate, and mixtures thereof.

10. The method of claim 1, wherein said composition comprises a layer having an average thickness prior to said contacting step, and said contacting step results in said layer being removed at a rate of from about 40-80 Å of thickness per second of solvent contact.

11. The method of claim 1, further comprising the step of cooling said composition after said curing step.

12. The method of claim 11, wherein said cooling step comprises exposing said composition to ambient conditions.

13. The method of claim 12, wherein said exposing is carried out for a time period of from about 20-40 seconds.

14. The method of claim 1, wherein said second curing step comprises heating the partially cured composition to a sufficient temperature and for a sufficient time to further cure the partially cured composition.

15. The method of claim 14, wherein said second curing step results in the partially cured composition being at least about 98% cured.

16. The method of claim 1, wherein said second curing step comprises heating the partially cured composition to a temperature of from about 195-250° C.

17. The method of claim 1, wherein said second curing step comprises heating the partially cured composition for a time period of from about 30-90 seconds.

18. The method of claim 1, wherein:
said substrate further comprises structure defining a via hole, said structure including sidewalls and a bottom wall; and
said applying step comprises applying the composition to at least a portion of said hole sidewalls and bottom wall.

19. The method of claim 18, wherein said hole is at least about 95% filled with said composition after said applying step.

20. The method of claim 1, wherein after said second curing step, said layer has an average thickness of less Than about 100 nm.

* * * * *